United States Patent [19]
Vokoun et al.

[11] Patent Number: 5,795,815
[45] Date of Patent: Aug. 18, 1998

[54] INTEGRATED CIRCUIT SCRIBE LINE STRUCTURES AND METHODS FOR MAKING SAME

[75] Inventors: Edward R. Vokoun, Boerne; Miguel A. Delgado; Gregory N. Carter, both of San Antonio, all of Tex.; Brian D. Richardson, Saratoga, Calif.; Rajive Dhar, Santa Clara, Calif.; Elizabeth A. Chambers, Mountain View, Calif.

[73] Assignee: VLSI Technology, Inc., San Jose, Calif.

[21] Appl. No.: 699,492

[22] Filed: Aug. 19, 1996

Related U.S. Application Data

[62] Division of Ser. No. 176,353, Dec. 30, 1993, Pat. No. 5,686,171.

[51] Int. Cl.$^6$ ............................................... H01L 21/301
[52] U.S. Cl. ............................................... 438/462
[58] Field of Search ............................... 437/226, 227; 29/412, 413; 438/462

[56] References Cited

U.S. PATENT DOCUMENTS 5,017,512  5/1991  Takagi .................... 437/227
5,300,816  4/1994  Lee ........................ 257/797

*Primary Examiner*—John Niebling
*Assistant Examiner*—Brendan Mee
*Attorney, Agent, or Firm*—Hickman & Martine, LLP

[57] ABSTRACT

A method for forming a scribe line on a semiconductor wafer including the steps of: (a) providing a semiconductor substrate; and (b) sequentially providing a plurality of layers over the semiconductor substrate of alternating conductive and insulating types, where each of the layers is provided with an elongated opening is formed relative to a desired scribe line position, and where the openings of at least some of the plurality of layers are wider than openings of preceding layers such that at least one sidewall of a completed scribe line has a pronounced slope extending outwardly from its base. The structure of the present invention is, therefore, a scribe line having sloped sidewalls that greatly reduces scribe line contamination problems and enhances planarization during subsequent spin-on-material processes. The scribe lines can either be elongated openings in the layers, or an elongated mesa formed in the layers.

28 Claims, 7 Drawing Sheets

(ARTIFACTS)

(PILE UP)

(TRAPS)

INTEGRATED CIRCUIT SCRIBE LINE STRUCTURES AND METHODS FOR MAKING SAME

This is a divisional of application Ser. No. 08/176,353, filed on Dec. 30, 1993, now U.S. Pat. No. 5,686,171.

BACKGROUND OF THE INVENTION

1. Field of the Invention

This invention relates generally to the manufacture of integrated circuits, and more particularly to the formation of horizontal and vertical scribe lines on an integrated circuit wafer which divide the wafer surface into a number of integrated circuit die areas.

2. Description of the Related Art

Integrated circuits are formed on semiconductor wafers typically made from silicon or gallium arsenide. Most often, the semiconductor wafer is made from silicon. These wafers are substantially round, but often include one or more "flats" or notches along their perimeters for the purposes of alignment during the integrated circuit fabrication process. The diameters of these wafers are continuously increasing, with four, six and eight inch diameter silicon wafers being common at the present time.

Since a single integrated circuit die is often no more than 1 $cm^2$, a great many integrated circuit die can be formed on a single semiconductor wafer. After the semiconductor wafer has been processed to form a number of integrated circuit die on its surface, the wafer is cut along "scribe lines" to separate the integrated circuit die for subsequent packaging and use.

FIG. 1 illustrates a processed semiconductor wafer 10 in accordance with the prior art. FIG. 1a is an enlarged, cross-sectional view of the portion of FIG. 1 encircled by the line 1a. As seen in FIGS. 1 and 1a, the processed semiconductor wafer 10 includes a number of integrated circuit die 12 which are separated by horizontal scribe lines 14 and vertical scribe lines 16. The horizontal scribe lines 14 are evenly spaced and parallel to each other. Likewise, the vertical scribe lines 16 are evenly spaced and parallel to each other. The horizontal scribe lines 14 and the vertical scribe lines 16 intersect at substantially right angles. After the wafer 10 has been processed such that functional die 12 are present on the surface of the wafer, the wafer 10 is cut into individual integrated circuit die by cutting along the scribe lines 14 and 16. This cutting process, as it is well known to those skilled in the art, typically includes a sawing process or a laser cutting process.

As best seen in FIG. 1a, the processed semiconductor wafer 10 includes a substrate 18 and the number of layers 20 formed over the substrate 18. A vertical scribe line 16a can be seen formed in the layers 20. It should be noted that a "scribe line" is often an elongated slot, groove, or opening provided through layers formed over a substrate, rather than a physical structure. In some instances the scribe line is filled with a material such as silicon dioxide, thereby creating a scribe line having a physical structure. Alternatively, the scribe line might be an elongated raised area or "mesa" bounded on one or both sides by openings.

There may be as few as two or three layers 20, but often there will be eight or ten or even more layers 20 formed over the substrate 18. As it is well known to those skilled in the art, these layers 20 typically alternate between conductive-type layers and insulating type layers. A particular layer can include several sub-layers, i.e. a conducting layer can comprise several conducting sub-layers, such as an aluminum layer over a titanium-tungsten alloy layer, and insulating type layers can comprise several sub-layers such as a plasma enhanced chemical vapor deposition (PECVD) layer, a spin-on-glass (SOG) layer, or other layer over an oxide layer, etc.

Practically speaking, the scribe lines such as scribe line 16a must be created concurrently during the formation of each of the layers 20. This is because a scribe line (such as scribe line 16a) is formed by an etching process which sequentially etches openings into the various layers. Since the various layers 20 of the processed wafer 10 are of different types and have different etching characteristics, the openings defining a scribe line 16a are preferably etched layer-by-layer as the layers are deposited. The scribe lines, such as scribe line 16a, may, as a last step, be filled with an oxide (not shown) or other insulation material to inhibit chipping and contamination of the scribe line area. Alternatively, mesa type scribe lines can be formed.

As used in the art, the term "opening" is be construed differently from the term "feature." Features, as the term is used in the art, can be positive (such as a mesa) or negative (such as a groove or slot). Some scribe lines of the prior art are elongated mesas (i.e. positive features), while other scribe lines of the prior art are elongated openings (i.e. negative features). Therefore, openings can comprise a scribe line, or these openings can be formed on both sides of a mesa which comprises a scribe line.

The dimensions of a scribe line, such as scribe line 16a, can vary considerably. For example, the width w of scribe line 16a is often in the range of 100–200 microns. The height H of the scribe line 16a may be 1.5–3 microns high. These dimensions are dependent on the design technology used by the integrated circuit designer.

It should be noted that the vertical and horizontal scales of FIG. 1a, and the vertical and horizontal scales of the remaining figures, are not the same in the horizontal and vertical directions. In the figures, the scale in the horizontal direction has been shrunk as much as two orders of magnitude relative to the scale in the vertical direction. These different scales are necessitated if both sidewalls of a scribe line are to be shown simultaneously without shrinking the height of the layers 20 excessively.

As the feature size of integrated circuits decreases, they become more susceptible to contamination. Contamination from scribe line artifacts has recently become a concern. The formation of scribe line artifact will be discussed with reference to FIGS. 2a and 2b.

In FIG. 2a, a number of layers 20' are formed over a semiconductor substrate 18'. A layer 22 is conformably deposited over the layers 22 and within a scribe line 24. Next, a mask 26 (typically comprising patterned photoresist) is formed over the layer 22 and exposed areas of the layer 22 are etched away. The etching is usually accomplished by an ansiotropic process such as a plasma etch process.

Unfortunately, as seen in FIG. 2b, the etching process is not always successful at removing all the materials within a scribe line 24. More particularly, "artifacts" 28 are often retained at the intersection between the base 30 and the sidewalls 32a and 32b of the scribe line 24. These artifacts 28 are not particularly damaging unless they become dislodged as indicated at 28' and land on an active portion of an integrated circuit die 12. For example, if the artifact 28' is conductive, it can short-out conductive features of an integrated circuit die. However, even if the artifact 28' comprises an insulating type material, it can cover or shadow a crucial portion of an integrated circuit die during the formation of the die, thereby destroying its functionality. These artifacts 28, which are intrinsically formed because the layer 22 is much thicker vertically next to the sidewalls 32a and 32b than it is on the base of the scribe line, have become a substantial source of integrated circuit contamination, and can greatly reduce the yield of functioning die 12 on a processed wafer 10.

Another problem encountered in the prior art is that of spin-on-material (SOM), such as photoresist or spin-on-glass (SOG). In FIG. 3, a number of layers 20" are formed over substrate 18" so as to provide a scribe line 34, and SOM layer 36 formed over the surface of the layers 20" by a liquid spinning process which tends to move the SOM material of layer 36 in a direction indicated by an arrow 38. This can cause a "pile-up" in an area 40 of the layer 36 and reduce the thickness in an area 42 of the layer 36. This is due to the impingement of the liquid SOM material 36 against a vertical sidewall 44 the scribe line. A thinner area 42 can be problematic because it is possible that there will be insufficient coverage on all portions of the wafer. The thickened portion 40 reduces the planarity of the semiconductor wafer 10, thereby making it more difficult to process subsequent layers formed over the SOM layer 36.

Another scribe line related problem is illustrated in FIG. 4. The illustrated problem is referred to as "trap." In a trap, a number of layers 20''' are formed over a substrate 18'''. A scribe line 46 is defined in the layers 20'''. Sometimes, due to a misalignment of the masks used to pattern the layers, or due to undercutting by an etching process, or due to other factors, the sidewalls 48a and 48b of the scribe line are not entirely vertical. This can allow particles, such as particles 50a and 50b to become trapped by the sidewalls 48a and 48b, respectively, of the scribe line 46. These "particles", as the term is used by those skilled in the art, typically refer to airborne, liquid carried, or other foreign origin particles that were never a part of the wafer or any of its layers. As used herein, the term "particle" also include "debris", which is used by those skilled in the art to refer to matter that was once part of the wafer or one of the layers and which was subsequently dislodged as a separate bit of matter. Debris, for example, can comprise sidewall polymers from plasma etching or residual filaments from a deposited film.

If the particles 50a or 50b do not move, the trapping of the particles is not particularly problematical. However, the particles 50a or 50b become dislodged during the processing of the semiconductor wafer 10, they can contaminate one of the integrated circuit dies 12. Therefore, the "trap" problem is another source of potential contamination derived from the scribe line structure of the prior art.

Also, as seen in FIG. 4, the bottom of the scribe line 46 can form a "trench" 51. As is well known to those skilled in the art, this trenching occurs due to over-etching of one or more layers. Trenching is generally considered to be undesirable because it reduces the planarity of the substrate.

SUMMARY OF THE INVENTION

The present invention provides several scribe line structures, and methods for producing them, which substantially increase the yield of functional integrated circuit die by reducing the problems of scribe line artifacts, traps, and SOM pile-up. The present invention accomplishes these improvements by sloping one or both of the sidewalls of the scribe line.

More particularly, a method for forming a scribe line includes the steps of: (a) providing a substrate; (b) providing a first layer over the substrate; (c) creating a first elongated opening of a first width in the first layer relative to a desired scribe line position; (d) providing a second layer over the first layer; and (e) creating a second elongated opening of a second width in the second layer relative to the desired scribe line position, where the second width is greater than the first width. The method provides a scribe line that is at least partially defined by the first opening and the second opening and having a pair of opposing sidewalls, where at least one of the sidewalls has a step between the first layer and the second layer to create a sidewall slope. A third layer can be provided over the second layer to cover the step between the first and second layers and to seal the exposed edges of the first and second layers. The opening structure can comprise the scribe line, or can define a sidewall of a mesa-type scribe line.

A scribe line structure made by the process of the present invention therefore has one or more sloped sidewalls. More particularly, a scribe line structure for an integrated circuit includes a number of layers formed over a substrate, and an elongated, linear opening formed into the layers such that the opening defines a base and a pair of opposing sidewalls rising from the base. In several preferred embodiments of the present invention, both of the sidewalls are sloped, and they extend away from the base in opposite directions. The slope in the sidewalls is provided by a sequential enlargement of the width of the opening between at least some of the layers to thereby form steps in the sidewalls. Preferably, the scribe line structure also includes a sealing layer formed over the stepped layers to cover the steps and to seal the edges of the layers which face the opening.

The sloped sidewalls of the scribe line of the present invention are very advantageous in reducing potential contamination of integrated circuit die. Artifacts (such as the artifact 28 of FIG. 2b) are much less likely to be formed because the thickness of a layer on a step is much less than the thickness of the material which can form along the sidewalls 32a and 32b of the prior art. In consequence, the layers over the steps are much more likely to be fully etched away than the layers next to the vertical sidewalls of the prior art. The sloped sidewall structure also substantially eliminates the problem of "traps" as illustrated in FIG. 4.

In addition to greatly reducing sources of scribe line contamination, the sloped sidewalls of the scribe lines of the present invention substantially reduce the pile-up problem illustrated in FIG. 3. This is because the sloped sidewalls does not present as much of a barrier for the smooth distribution of SOM over the surface of the wafer as do the vertical sidewalls of the prior art. The combination of reduced contamination and greater planarization due to the lack of the pile-up problem results in greater yield and product reliability of functional integrated circuit die in wafers using scribe lines in accordance with the present invention.

These and other advantages of the present invention will become apparent upon reading the following detailed descriptions and studying the various figures of the drawings.

DETAILED DESCRIPTION OF THE PREFERRED EMBODIMENTS

FIGS. 1, 1A, 2A–2B, and 3–4 were discussed with reference to the prior art. FIGS. 5A–5F will be discussed with reference to a first embodiment of the present invention.

Figure 1:
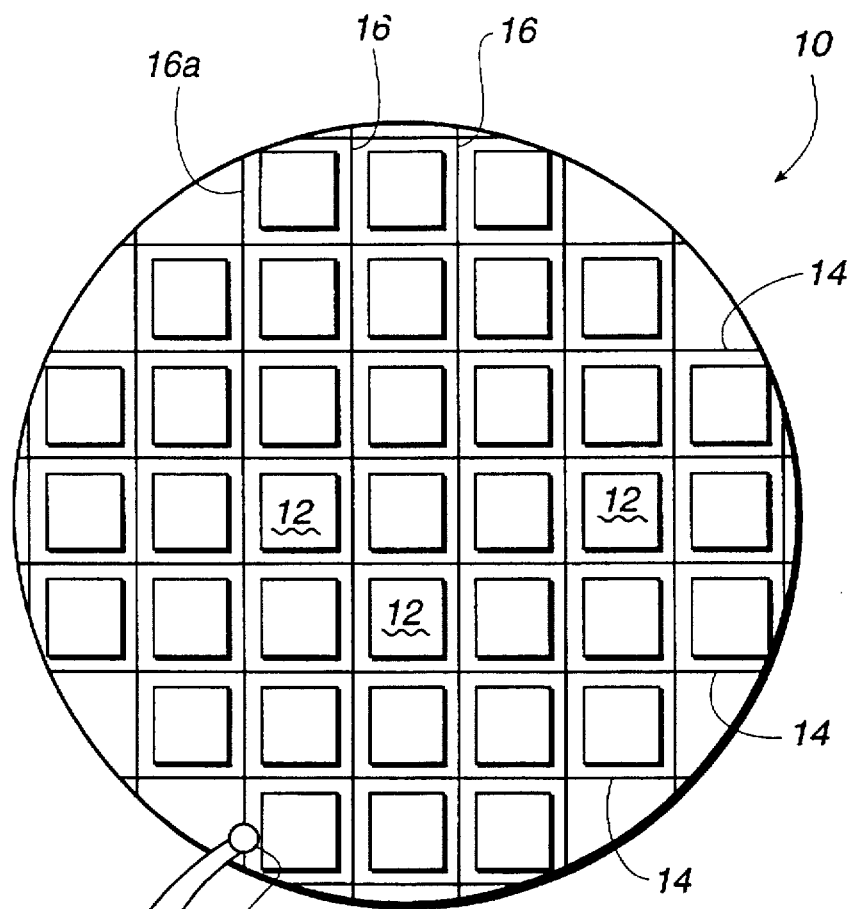
FIG. 1 is a top plan of view of a prior art, processed semiconductor wafer having a number of integrated circuit die separated by a number of vertical and horizontal scribe lines.
Figure 1A:
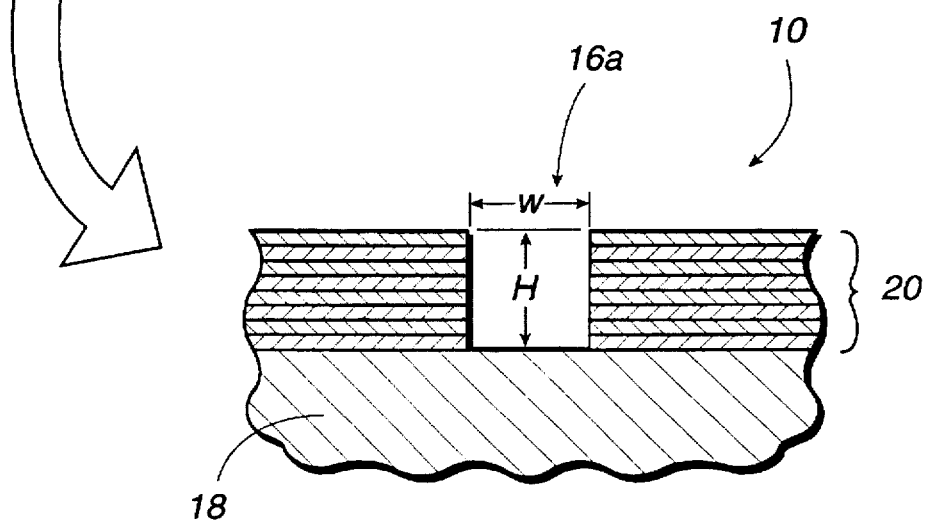
FIG. 1a is an enlarged, cross sectional view taken along line 1a of FIG. 1.
Figure 2A:
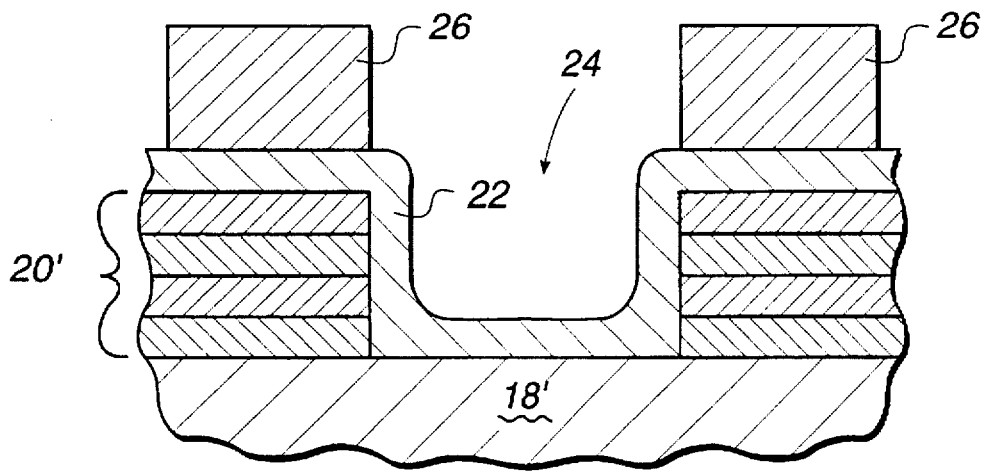
FIGS. 2a and 2b illustrate the disadvantageous generation of potentially contaminating artifacts when producing prior art scribe lines.
Figure 2B:
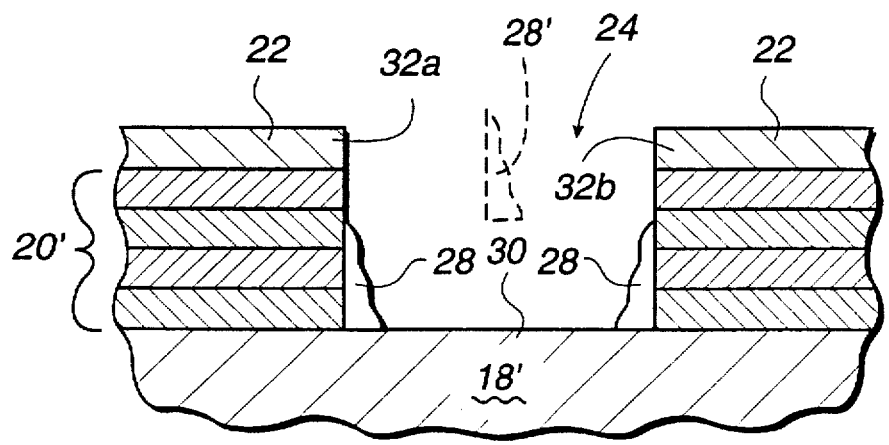
Figure 3:
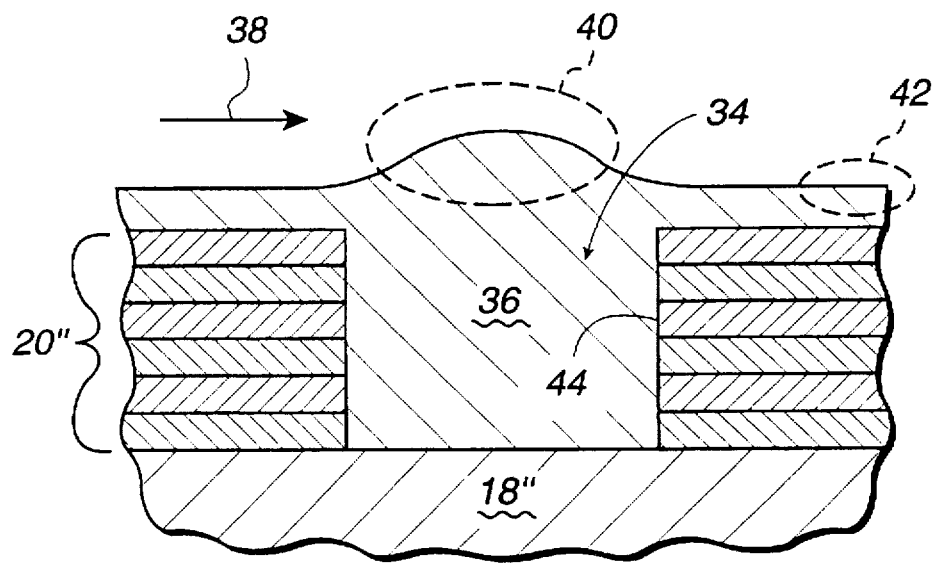
FIG. 3 illustrates the "pile-up" problem when applying spin-on material over prior art scribe lines.
Figure 4:
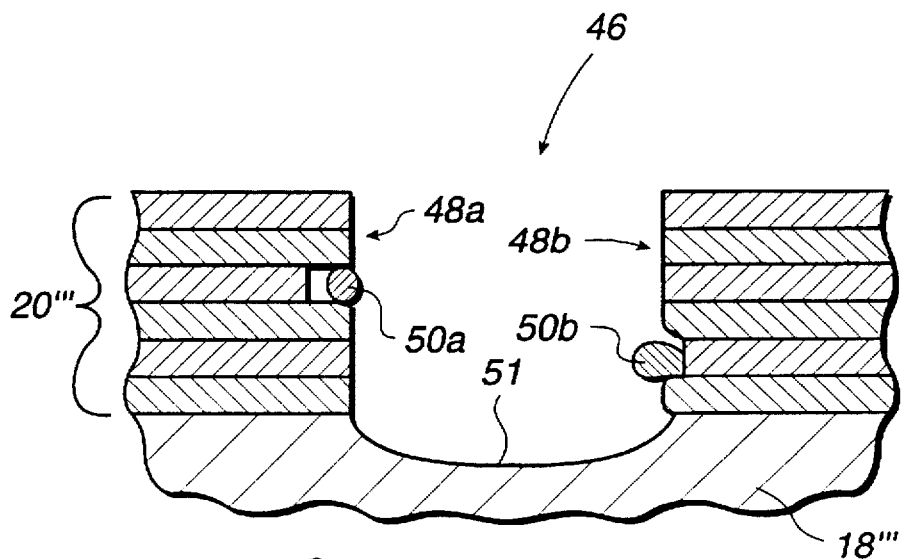
FIG. 4 illustrate the "trap" problem with prior art scribe lines.
Figure 5A:
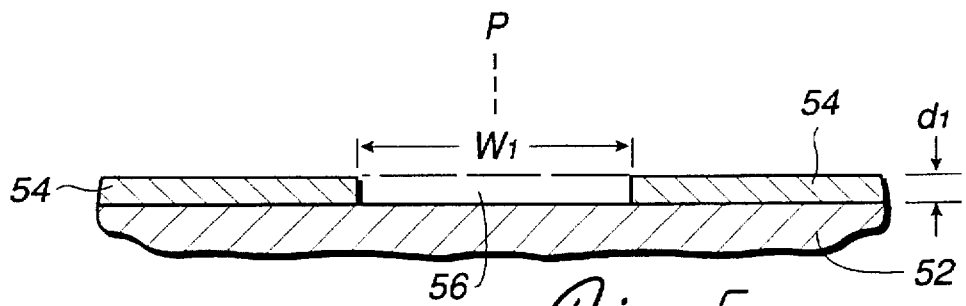
FIGS. 5a–5f illustrate a first method and structure to make a scribe line over a semiconductor wafer in accordance with the present invention.

In FIG. 5A, a substrate 52 is provided with a first layer 54, which is patterned to form a first opening 56. Preferably, substrate 52 is a silicon substrate and can be of any suitable diameter, e.g. 4 or 6 inches in diameter. Substrate 52 can be a bare silicon wafer, or the substrate may be doped and/or provided with sub-layers beneath the first layer 54, such as an epitaxial silicon layer or a base oxide layer.

In the following descriptions, a number of dimensions will be provided by way of illustration only. The actual dimensions are dependent upon the technologies used, the minimum feature sizes desired, and a number of other design factors. However, the dimensions presented below by way of example are typical for standard technologies currently in use.

The first layer 54 of FIG. 5A is formed by any suitable method. For example, if the first layer 54 is a silicon dioxide ("oxide") layer, it is typically deposited by a chemical vapor deposition (CVD) process, as is well known to those skilled in the art. If the layer 54 is a metal layer, such as aluminum, it is typically produced by a physical vapor deposition (PVD) or "sputter" process, as is also well known to those skilled in the art. A typical depth $d_1$ of the first layer is about 0.3–1.2 microns. Of course, this depth and the depth of subsequent layers is highly dependent upon the type of material used to form the layer, the feature sizes of the integrated circuits being formed, and a variety of other factors.

The opening 56 is typically formed by a photolithography process. A typical width $w_1$ for the opening 56 is about 60 microns. As used herein, a "photolithography process" and "patterning" of a layer includes the steps of applying a photoresist over the surface of a layer to be patterned, curing the photoresist so that it is in a photosensitive state, exposing the photoresist to a pattern of energy, developing the photoresist to form a mask over the layer to be patterned, etching the layer through the mask by an etching process which is selective for that layer type, and subsequently removing the mask. The pattern of energy is usually provided by exposing the photoresist to a light source through a glass integrated circuit mask, but the pattern of energy may also be provided by a scannable energy source, such as an electron beam. The photolithography process as described above is well known to those skilled in the art.

As mentioned previously, the term "opening" is often differentiated by those skilled in the art from the term "feature." As used herein, an "opening" is an elongated groove or slot provided in one or more layers of a semiconductor structure which can form an opening in the layer(s), or which, can form a side of a mesa. While several preferred embodiments of the present invention will discuss the formation of elongated openings or openings in the layers as forming scribe lines, it is to be understood that the formation of openings can also for mesa type scribe lines. The mesas so formed have sloped sidewalls to provide the advantages of the present invention.

Figure 5B:
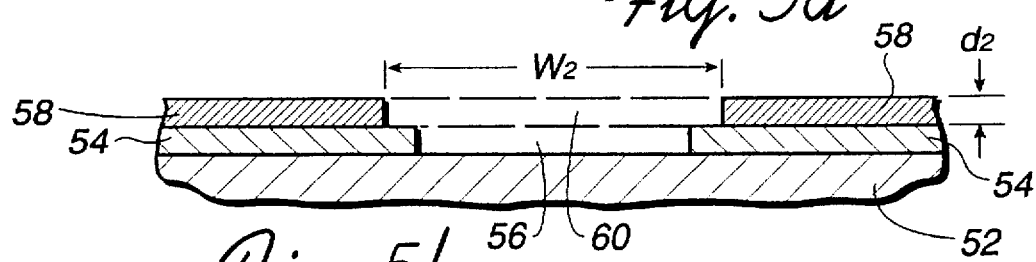
Figure 5C:
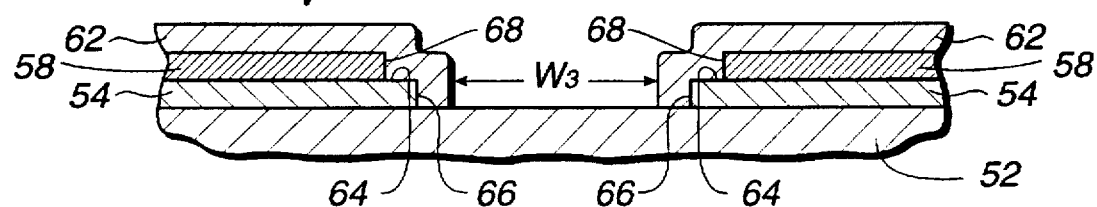

In FIG. 5b, a second layer 58 is formed over the first layer 54 and is patterned by a photolithography process to produce a second opening 60. The depth $d_2$ of the second layer 58 is preferably about 0.15–1.2 microns, and the width $w_2$ is preferably about 64 microns. Again, these dimensions are very technology dependent, but are typical for this example. Next, in FIG. 5c, a third layer 62 is formed over the second layer 54 and is patterned to have a base width $w_3$ of about 56 microns The layer 62 covers a pair of steps 64 performed between layers 54 and 58, and also covers and seals the edges 66 of layer 54 and edges 68 of layers 58 which were exposed by the formation of the openings 56 and 60 respectively.

Figure 5D:
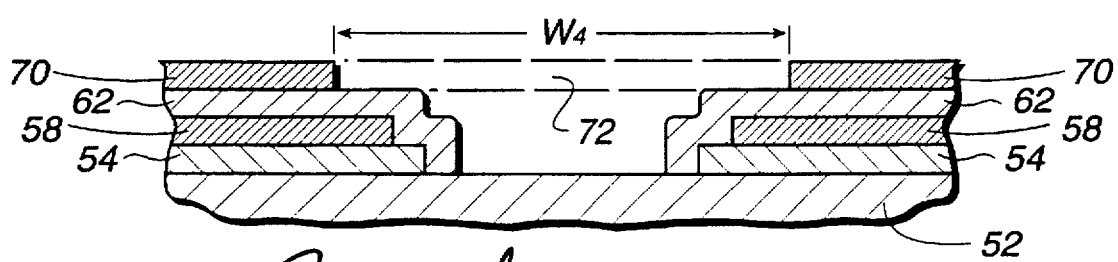
Figure 5E:
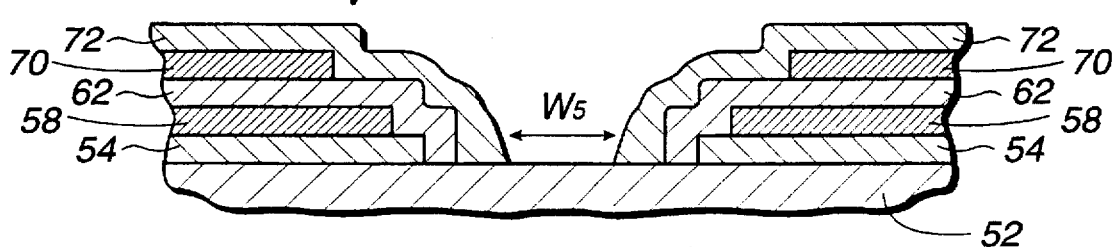

In FIG. 5d, a fourth layer 70 is formed over the third layer 62 and is patterned to form an opening 72 having a width $w_4$. This width $w_4$ is typically approximately 68 microns, which is four microns wider than the width $w_2$ of the opening 60, which was four microns wider than the width $w_1$ of the opening 56. Next, in FIG. 5e, a fifth layer 72 is formed over a fourth layer 70 and is patterned by photolithography such that its width $w_5$ is less than the width $w_3$ of the layer 62. Typically, the width $w_5$ is about 52 microns.

Figure 5F:
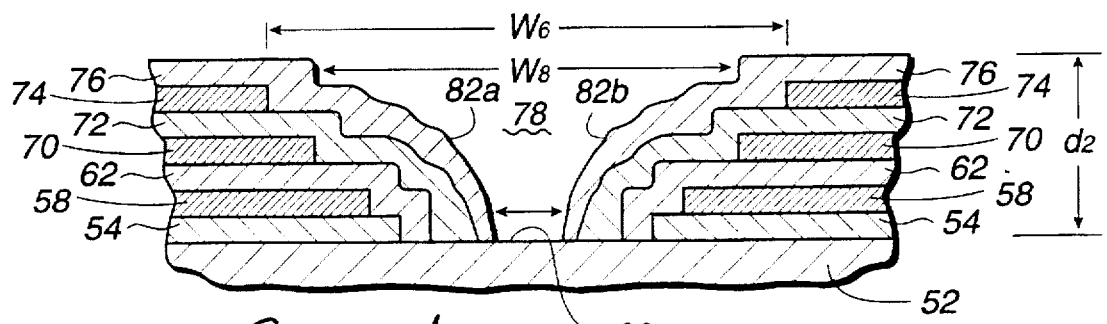

FIG. 5f shows the end results of the formation of another patterned layer 74, and the subsequent formation of a patterned layer 76. The width $w_6$ of the opening in layer 74 is preferably about 72 microns, and the layer 76 has an opening with a width $w_7$ which is approximately 46 microns. The width $w_8$ of a scribe line 78 is somewhat less than the width $w_6$ because of addition of layer 76. Typically, on a seven layer structure as illustrated in FIG. 5f the width $w_8$ of the opening to the scribe line is about 68 microns. The height $d_2$ is about 1.25–3 microns, depending upon the technology used. The scribe line is, of course, an elongated structure which is formed substantially all the way across a semiconductor wafer.

The scribe line structure 78 shown in FIG. 5f has a base 80 and opposing sidewalls 82a and 82b which extend upwardly and outwardly from the base 80. If there are relatively few layers, as was the case illustrated in FIGS. 5b–5d, there will be a pronounced stepping in the sidewalls 82a and 82b. However, as the number of layers increases, the sidewall stepping will become smoother due to the layers 62, 72, and 76.

The sloped sidewalls 82a and 82b of the scribe line 78 are much less likely to trap particles or to contribute to the pile-up of spin-on materials than the straight sidewalls of prior art scribe lines. Also, since the layers are being formed in a sequential fashion, there are no tall, vertical sidewall portions to promote the formation of artifacts which might contaminate integrated circuit die of the silicon wafer. Finally, the layers 62, 72, and 76 seal the edges of layers 54, 58, 70, and 72, and reduce the chance of particle formation due to chipping and the like.

It is therefore apparent that a method for forming scribe lines in accordance with the present invention includes the steps of providing a substrate 52, providing a first layer 54 over the substrate, creating a first elongated opening (shown here in cross-section) of a first width $w_1$ in the first layer relative to a desired scribe line position P, providing a second layer 58 over the first layer, and creating a second elongated opening $w_2$ in the second layer relative to the desired scribe line position P, where the second width $w_2$ is greater than the first width $w_1$. The two layers at least partially form a scribe line having a pair of opposing sidewalls, where each of the sidewalls have a step between the first layer and the second layer to create a slope for the sidewalls.

By "relative to" it is meant that the opening has a defined relationship to the scribe line position. In the case where the scribe line is an opening, "relative to" is substantially the same thing as "in alignment with." In the case where the scribe line is a mesa, "relative to" is parallel to but laterally displaced relative to the scribe line.

Preferably, the layers formed over the substrate 52 alternate between conductive layer types and insulating layer types. For example, if layer 54 is an insulator layer type, layer 58 is preferably a conductive layer type, and layer 62 is preferably an insulating type. Alternatively, if layer 54 is a conductive layer type, layer 58 is preferably an insulator layer type, and layer 62 is preferably an conductive layer type.

The method of the present invention optionally further includes the step of providing a third layer 62 over the second layer 58, where the third layer 62 is of the same layer type as first layer 54. Preferably, the third layer covers the step 64 between the first layer 54 and the second layer 58 and seals the edges 66 of the first layer and 68 of the second layer which were exposed by the creation of the first opening 56 and the second opening 60, respectively. By sealing the edges, another source of contamination can be contained, e.g. chipping of the edges of the layers.

It should be noted that while that it is preferred for the various layers to alternate between insulating layer types and conductive layer types, it not necessarily that they do so. For example, an insulating layer can be place over another insulating layer and it can be stepped back as described previously. Also, a single layer type can comprise a number of sub-layers. For example, it is not unusual to create a three-level conductive layer comprising a first sub-layer of titanium tungsten (TiW), a second sub-layer of aluminum, and a third sub-layer of TiW. Likewise, insulating layers can be created from several sub-layers.

While the present invention is not intended to limit the materials or compounds comprising the insulating layer types or the conductive layer types, there are several groups of material which have been found to be preferable for use in the present invention. Of the insulating layer types, the most preferable layer types are oxides (such as silicon dioxide), nitrides (such as silicon nitride), and spin-on materials (such as photoresist or spin-on-glass). Of the conductive layer types, the most common include various metals and alloys such as aluminum, aluminum-copper alloy, titanium, tungsten, and titanium-tungsten alloy. Certain non-metals are also conductive such as polysilicon and silicides and can serve as conductive layer types.

Figure 6A:
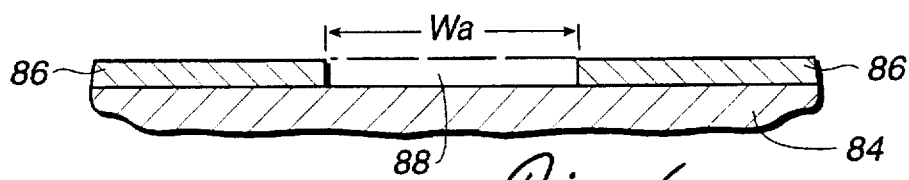
FIGS. 6a–6d illustrate a second method and structure to make a scribe line over a semiconductor wafer in accordance with the present invention.
Figure 6B:
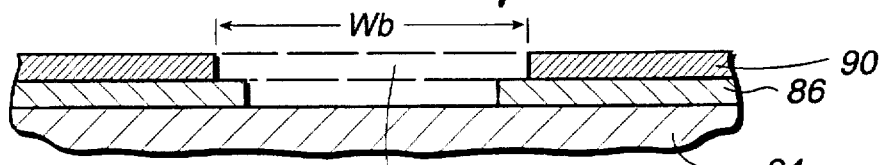
Figure 6C:
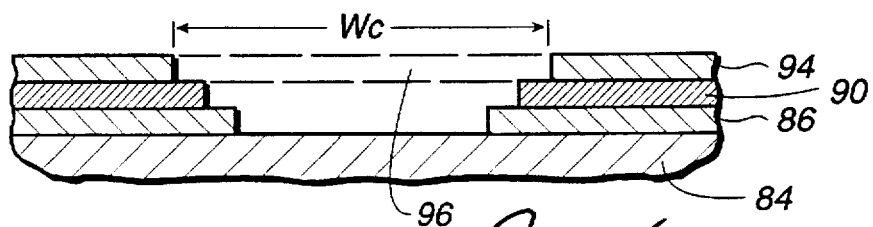

FIGS. 6a–6d illustrates a second embodiment of the present invention where each of the sequential layers are stepped to provide a pair of sloped sidewalls for a scribe line. In FIG. 6a, a substrate 84 is provided with a first; patterned layer 86 having an opening 88 of a width $w_a$. In FIG. 6b a second layer 90 is provided with a opening 92 having a width $w_b$. Next, in FIG. 6c, a patterned layer 94 is provided with an opening 96 of width $w_c$ over the layer 90. Finally, in FIG. 5d, a layer 98 is formed over the layer 94 such that it covers the steps 100, 102, and 104 of layers 84–90, and the edges of layers 84–94. The top of scribe line 106 therefore has width $w_d$, and bottom of scribe line 106 near a base 108 has width $w_e$. The layer 98 forms a pair sloped sidewalls 110a and 110b which extend outwardly from the base 108 in opposing directions. Typically, the mouth of the scribe line 106 has a width $w_d$ of about 100 microns, the base has a width $w_e$ of 46 microns, and the depth $d_3$ is about 2–3½ microns in this example.

Figure 7A:
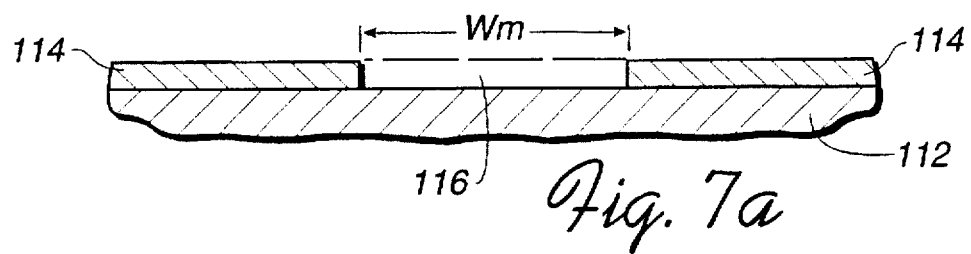
FIGS. 7a–7e illustrate a third method and structure to make a scribe line over a semiconductor wafer in accordance with the present invention.
Figure 7B:
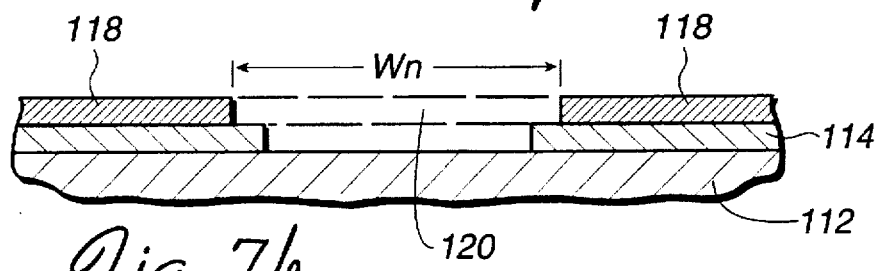
Figure 7C:
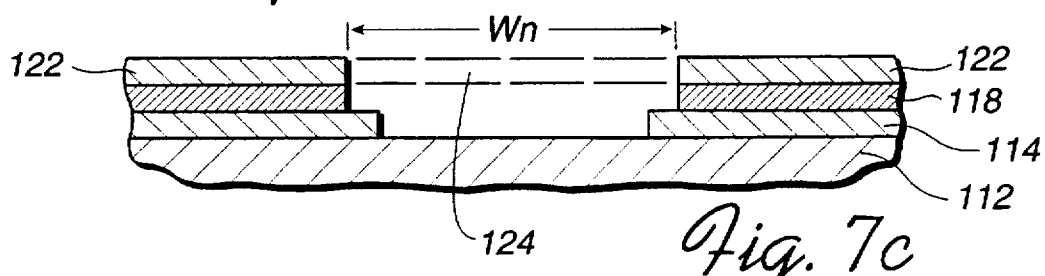
Figure 7D:
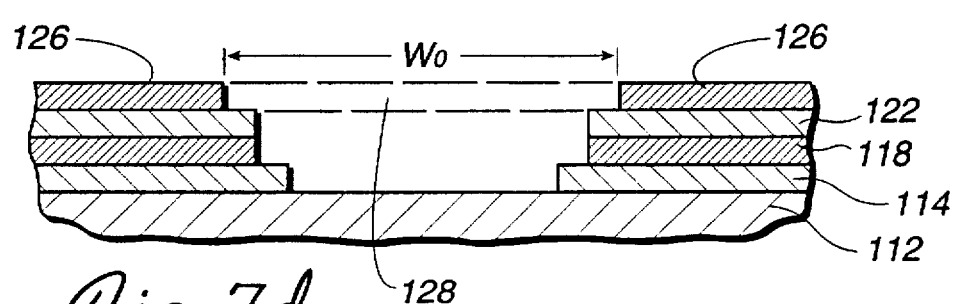

The third embodiment of the present invention is disclosed in FIGS. 7a–7e. In FIG. 7a, a substrate 112 is provided, and a first layer 114 is then formed over the substrate 112 and patterned to produce an opening 116 of a width $w_m$. Next, as illustrated in FIG. 7b, a second layer 118 is deposited and patterned to produce an opening 120 of width $w_n$. Next, as illustrated in 7c, a layer 122 is formed over the layer 118 and is patterned to provide an opening 124 of the same width $w_n$ as opening 120. In FIG. 7d, a layer 126 is formed over layer 122 and is patterned to form an opening 128 having a width $w_o$. Finally, in FIG. 7e, a layer 130 is deposited and patterned to form an opening 132 having width $w_o$, which is the same as the width $w_o$ of opening 128. A layer 134 is disposed over the top of layer 130 and covers and seals the edges of layers 114, 118, 122, 126, and 130. The scribe line 136 has base 138 and a pair of opposing sidewalls 140a and 140b which slope upwardly and away from the base 138. The width $w_q$ of the mouth of the scribe line 136 is typically about 100 microns, the width $w_p$ of the base is about 46 microns, and the depth $d_4$ is about 2–3½ microns.

Figure 6D:
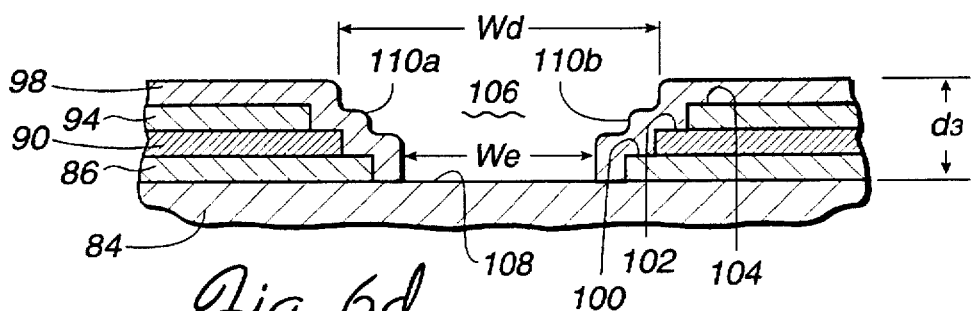
Figure 7E:
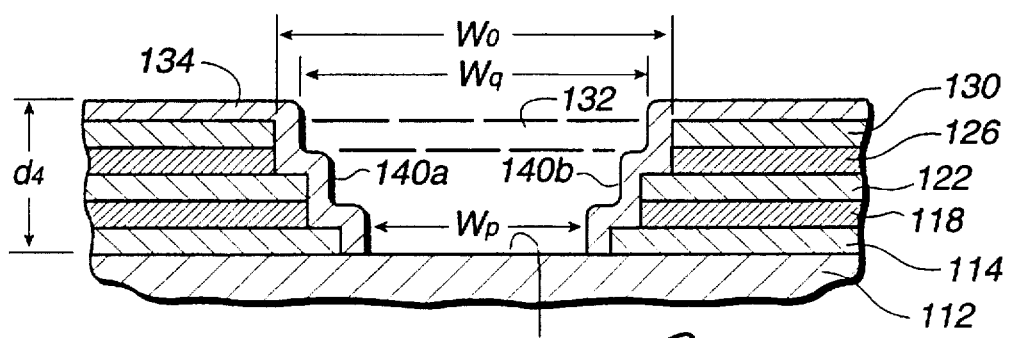

Each of the embodiments illustrated in FIGS. 5f, 6d, and 7e have advantages and disadvantages. The embodiment of FIG. 5f is advantageous in that sealing layer 62, 72, and 76 seal the edges of layers 58, 70, and 74 during the formation of the scribe line 78. This can reduce the formation of contaminants. However, the sealing layers 62, 72 and 76 reduce the width $w_7$ at the base of the scribe line 78 and, in the extreme, can possibly entirely cover the base 80 of the scribe line. This would be disadvantageous because it can form a trap for particles.

The embodiment of FIG. 6d does not suffer from this potential trap problem in that the width $w_e$ of the base 108 is only slightly less than the width $w_a$ of the first opening 88. However, by stepping every layer as indicated, the width $w_d$ of the opening or mouth of the scribe line greatly increases. It is not desirable to have a scribe line that is too wide, because this consumes valuable real estate on the wafer surface. Furthermore, the sidewalls 110a and 110b do not tend to be as smooth as the sidewalls 82a and 82b of FIG. 5f because this embodiment lacks the several layers 62, 72, and 76 of the previous embodiment which serves to smooth the sidewall contours.

The embodiment of FIG. 7e is advantageous in that the width $w_p$ of the base 38 is only slightly less than the width $w_m$ of the opening 116 and because the width $w_q$ at the top of the scribe line 36 is not as wide as width $w_d$ of the embodiment of FIG. 6d. However, by aligning two successive layers, such as aligning layers 118 and 112, and aligning layers 126 and 130, tall, vertical sidewall portions are formed which are more susceptible to the formation of artifacts, such as the artifact 28 of FIG. 2b.

It is therefore clear that the actual method and structure utilized for a particular integrated circuit application is dependent upon the number of layers that are desired, the dimensions desired for the finished scribed line, and processing parameters. However, the common, unifying concept of all the disclosed embodiments is that a sloped sidewall or sidewalls are provided for a scribe line by having one or more layers provided with an opening that is wider than one or more openings in preceding layers. For example, in the embodiment of FIGS. 5a–5f, the width $w_6$ is greater than the width of $w_4$ which is greater than the width of $w_2$ which is greater than the width of $w_1$. With the embodiment of FIGS. 6a–6d, the width $w_c$ is greater than the width of $w_b$ which is greater than the width of $w_a$. The embodiment of FIG. 7a–7e, the width $w_o$ is greater than the width $w_n$ which is greater than the width $w_m$. By sequentially expanding the width of a sequence layers, a slope can be provided for the sidewalls of the scribed line, thereby providing the advantages of the present invention.

Certain dimensions of scribe lines are chosen to conform to certain conventions. For example as explained previously, the width of a scribe line of the prior art is typically in the range of 100–200 microns. It is therefore preferable to have a sloped sidewall scribe line of the present invention have an opening or mouth width in the same range. The base of the scribe line is somewhat arbitrary and may be closed off. Each step width in the sidewalls is preferably in the order of about 2 microns, which means that the width for an opening increases about 4 microns per step. Therefore, certain embodiments of the present invention might be more suitable than others depending on the number of layers being deposited and the desired scribe line configuration dimensions.

Figure 8:
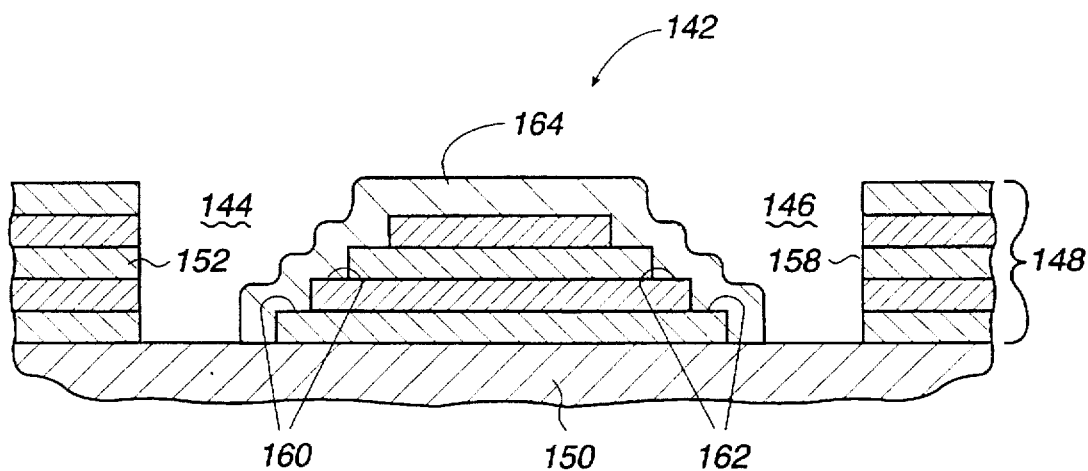
FIG. 8 illustrates a fourth scribe line structure of the present invention.

In FIG. 8, a mesa-type scribe line 142 is shown. The mesa-type scribe line 142 can be formed by essentially the same processes as described in the previous embodiments. The scribe line 142 can be formed by forming a pair of parallel, but spaced apart, elongated openings 144 and 146 through a plurality of layers 148 over a semiconductor wafer 150. These openings 144 and 146 can be formed as previously described.

Opening 144 has sidewalls 152 and 154. Similarly, opening 146 has sidewalls 156 and 158. Sidewall 154 of opening 144 and sidewall 158 of opening 146 form the two sidewalls for the mesa-type scribe line 142. The scribe line 142 therefore has opposing, sloped sidewalls that have a plurality of steps 160 and 162 which provide for an inward slope to the sidewalls 154 and 158, respectively. The scribe line 142 includes a sealing layer 164 to cover the steps 160 and 162 and to seal the edges of the layers 148.

It should be noted that the sidewall 152 of opening 144 and the sidewall 156 of opening 146 are substantially vertical in this example. In some embodiments, they may even be provided with a slight inward slope relative to openings 144 and 146, as opposed to the outward slopes of sidewalls 154 and 158, respectively. This prevents the openings 144 and 146 from becoming too wide. Alternatively, the sidewalls 152 and 156 can also be sloped outwardly to mirror sidewalls 154 and 158, respectively, to further reduce the possibility of contamination.

Figure 9:
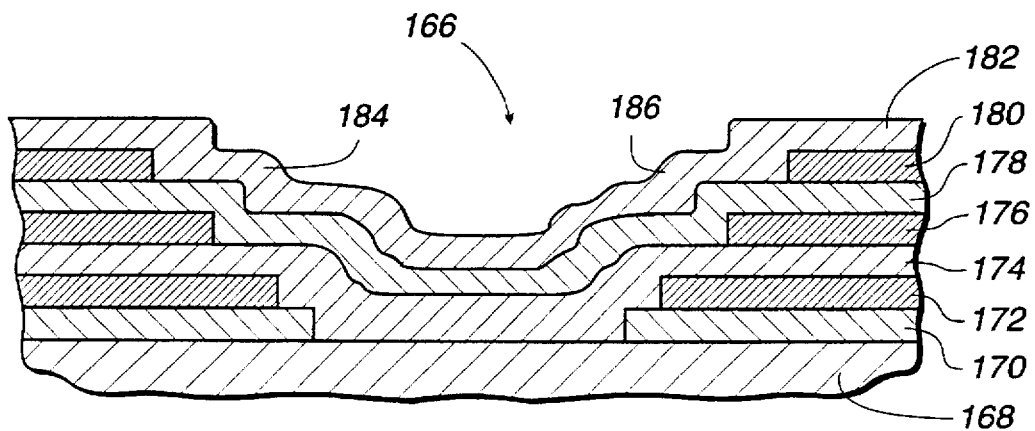
FIG. 9 illustrates a structure in accordance with the present invention which includes an etch-stop layer.

In FIG. 9, an alternate embodiment of a scribe line 166 is illustrated. The scribe line 166 is shallower (i.e. a lower total step) and has less steeply sloped sidewalls compared to scribe lines described previously. It has been found that the less steep the sidewalls, and the lower the total step, the less likely that artifacts (such as the artifacts illustrated in FIG. 2b) will be formed. In the present embodiment, the reduced total step and less steeply sloped sidewalls are accomplished with the addition of an etch-stop layer.

More particularly, a wafer 168 is provided with a first layer 170 and a second layer 172 by processes described previously, especially with reference to FIGS. 5a and 5b. Next, an "etch-stop" layer 174 is provided over layer 172, but is not etched to form a central opening. Subsequently, layer 176 is deposited and etched-back to make an opening, and a second etch-stop layer 178 is formed over the layer 176. Another layer 180 is deposited and etched to form an opening, and a final layer 182 is formed over the layer 180. Again, the processes for depositing and patterning these layers were discussed previously.

The layers, as before, alternate between conductive and insulating layers. In this example, layers 170, 174, 178 and 182 are insulating layers (such as $SiO_2$), and layers 172, 176, and 180 are conductive layers (such as aluminum, TiW, etc.). In other embodiments, the conductive layers can be substituted for insulating layers, and vice versa. In either event, the etch-stop layer(s) are made of a material that is resistant to the etching chemistry of the layer above it. For example, a layer 174 of $SiO_2$ will be resistant to most etchants of the conductive layer 176 above it. Therefore, the etch-stop layer 174 will prevent further trenching of the substrate 168 of the type illustrated in FIG. 4.

In effect, the etch-stop layer 174 becomes a new substrate for the subsequent stepped layers. The layer 174 is illustrated to be thicker than the other layers, but it is not necessary that it is thicker. In this example, layer 174 is about 2 microns deep, while the other layers are, perhaps, 1 micron deep. However, a much thinner layer 174, e.g. 1 micron or less, will also be an effective etch stop. It is, nonetheless, known in the industry that a thick etch-stop layer can be used to reduce capacitance between adjacent conductive layers (such as layers 172 and 176) and, therefore, a thicker etch-stop layer 174 is illustrated in this FIG. 9. A thinner etch-stop layer is illustrated by layer 178.

Thus, the provision of one or more etch-stop layers has several advantages. First, it reduces the total step height of the scribe line 166 and creates a gentler slope to its sidewalls 184 and 186 to further reduce artifact formation. Second, it greatly reduces trenching at the bottom of the scribe line 166 into the wafer 168.

While this invention has been described in terms of several preferred embodiments, there are alterations, permutations, and equivalents which fall within the scope of this invention. For example, it is apparent that while a preferred embodiment of the present invention has sloped sidewalls on both sides of the scribe line, other embodiments of the present invention can slope only one side or the other of the scribe line with a simple modification of the integrated circuit masks. It is therefore intended that the following appended claims be interpreted as including all such alterations, permutations, and equivalents as fall within the true spirit and scope of the present invention.

What is claimed is:

1. A method for forming a scribe line in multiple layers provided over a substrate comprising the steps of:

providing a substrate;

providing a first layer over said substrate;

creating a first elongated opening of a first width in said first layer relative to a desired scribe line position;

providing a second layer over said first layer;

creating a second elongated opening of a second width in said second layer relative to said desired scribe line position, said second width being equal or greater than said first width, said first layer and said second layer forming a first tier;

providing a third layer over said second layer; such that said third layer covers said first and second layers exposed during formation of said first and second elongated openings in said first and second layers;

providing a fourth layer over said third layer;

creating a third elongated opening of a third width in said fourth layer relative to said desired scribe line position, said third width being greater than said second width;

providing a fifth layer over said fourth layer, creating a fourth elongated opening of a fourth width in said fifth layer relative to said desired scribe line position, said fourth width being equal to or greater than said third width, said fourth layer and said fifth layer forming a second tier, such that a scribe line is at least partially defined by said first, second third and fourth openings, said scribe line defining a pair of opposing sidewalls, where at least one of said sidewalls have a step between said first tier and said second tier to create a slope on said at least one sidewall.

2. A method as recited in claim 1 where in said substrate is a semiconductor wafer, and wherein said first, second third fourth, and fifth layers include alternating insulating and conductive layers.

3. A method as recited in claim 1 wherein said insulating layers are selected from the group consisting essentially of oxides, nitrides, and spin-on materials, and wherein said conductive layers are selected from the group consisting essentially of:

(a) metals consisting essentially of aluminum, aluminum-copper alloy, titanium, tungsten, and titanium-tungsten alloy; and (b) non-metals consisting essentially of polycrystalline semiconductor materials and silicides.

4. A method as recited in claim 3 wherein said first third and fifth layers are insulating layers, and wherein said second and fourth layers are conductive layers.

5. A method as recited in claim 3 wherein said first, third and fifth layers are conductive layers, and wherein said second and fourth layers are insulating layers.

6. A method a recited in claim 1, further comprising the step of providing a sixth layer over said fifth layer, such that said sixth layer covers edges exposed during formation of said openings in said first, second, third, fourth and fifth layers.

7. A method for forming a scribe line in multiple layers provided over a semiconductor substrate comprising the steps of:

providing a semiconductor substrate;

sequentially providing a plurality of tiers over said semiconductor substrate, wherein each one of said tiers is comprised of at least one layer and at least one of said tiers is comprised of a plurality of layers; wherein each of said layers in each of said tiers is provided with an elongated opening aligned with a desired scribe line position, wherein said openings of said sequential layers are provided with sequentially non-decreasing widths such that at least one sidewall of a completed scribe line has a slope.

8. A method as recited in claim 7 wherein said plurality of layers alternate between an insulating layer selected from the group consisting essentially of oxides and nitrides and a conductive layer selected from the group consisting essentially of metals, polycrystalline semiconductor material, and silicides.

9. A method as recited in claim 8 wherein said semiconductor substrate is a silicon substrate, said oxides and nitrides are silicon dioxide and silicon nitride, respectively, and said polycrystalline semiconductor material is polysilicon.

10. A method as recited in claim 8 wherein the openings of sequential layers of said conductive layers are provided with sequentially increasing widths to provide said sloped sidewall.

11. A method as recited in claim 8 wherein the openings of sequential layers of said insulating layers are provided with sequentially increasing widths to provide said sloped sidewall.

12. A method as recited in claim 8 wherein the openings of sequential layers of both said conductive layers and said insulating layers are provided with sequentially increasing widths to provide said sloped sidewall.

13. A method as recited in claim 7 further comprising the step of providing at least one etch-stop layer within said plurality of tiers.

14. A method for forming a scribe line in multiple layers provided over a substrate comprising the steps of:

providing a substrate;

providing a first layer over said substrate;

creating a first elongated opening of a first width in said first layer relative to a desired scribe line position, said first layer forming a first tier;

providing a second layer over said first layer; such that said second layer covers said first layer exposed during formation of said first elongated opening in said first layer;

providing a third layer over said second layer;

creating a second elongated opening of a second width in said third layer relative to said desired scribe line position, said second width being greater than said first width;

providing a fourth layer over said third layer, creating a third elongated opening of a third width in said fourth layer relative to said desired scribe line position, said third width being equal to or greater than said second width, said third layer and said fourth layer forming a second tier, such that a scribe line is at least partially defined by said first, second, and third openings, said scribe line defining a pair of opposing sidewalls, where at least one of said sidewalls have a step between said first tier and said second tier to create a slope on said at least one sidewall.

15. A method as recited in claim 14, wherein said substrate is a semiconductor wafer, and wherein said first, second, third, and fourth layers include alternating conductive layers and insulating layers.

16. A method as recited in claim 14, further comprising the step of providing a fifth layer over said fourth layer, such that said fifth layer covers edges exposed during formation of said openings in said first, second, third, and fourth layers.

17. A method as recited in claim 16 wherein said insulating layers are selected from the group consisting essentially of oxides, nitrides, and spin-on materials, and wherein said conductive layers are selected from the group consisting essentially of (a) metals consisting essentially of aluminum, aluminum-copper alloy, titanium, tungsten, and titanium-tungsten alloys; and (b) non-metals consisting essentially of polycrystalline semiconductor materials and silicides.

18. A method as recited in claim 14 wherein said first and third layers are insulating layers and wherein said second and fourth layers are conductive layers.

19. A method as recited in claim 14 wherein said first and third layers are conductive layers, and wherein said second and fourth layers are insulating layers.

20. A method for forming a scribe line in multiple layers provided over a substrate comprising the steps of:
providing a substrate;
providing a first layer over said substrate;
creating a first elongated opening of a first width in said first layer relative to a desired scribe line position;
providing a second layer over said first layer;
creating a second elongated opening of a second width in said second layer relative to said desired scribe line position, said second width being greater than said first width;
providing a third layer over said second layer;
creating a third elongated opening in said third layer relative to said desired scribe line position, said third elongated opening having a width substantially the same as said second width;
providing a fourth layer over said third layer;
creating a fourth elongated opening of a third width in said fourth layer relative to said desired scribe line position, said third width being greater than said second width;
providing a fifth layer over said fourth layer,
creating a fifth elongated opening of a fourth width in said fifth layer relative to said desired scribe line position, said fourth elongated opening having a width substantially the same as said third width, wherein said first, second, third, fourth and fifth layers form a scribe line having a pair of sloped sidewalls.

21. A method as recited in claim 20, wherein said substrate is a semiconductor wafer, and wherein said first, second, third, fourth and fifth layers include alternating conductive layers and insulating layers.

22. A method as recited in claim 21, further comprising the step of providing a sixth layer over said fifth layer, such that said sixth layer covers edges exposed during formation of said openings in said first, second, third, fourth and fifth layers.

23. A method as recited in claim 22, wherein said insulating layers are selected from the group consisting essentially of oxides, nitrides, and spin-on materials, and wherein said conductive layers are selected from the group consisting essentially of (a) metals consisting essentially of aluminum, aluminum-copper alloy, titanium, tungsten, and titanium-tungsten alloys; and (b) non-metals consisting essentially of polycrystalline semiconductor materials and silicides.

24. A method as recited in claim 20 wherein said first, third, and fifth layers are insulating layers and wherein said second and fourth layers are conductive layers.

25. A method as recited in claim 20 wherein said first third, and fifth layers are conductive layers, and wherein said second and fourth layers are insulating layers.

26. A method for forming scribe lines in multiple layers provided over a substrate comprising the steps of:
providing a substrate;
providing a plurality of layers over said substrate;
providing a plurality of substantially parallel, horizontal scribe lines with sloped sidewalls in said plurality of layers, each of said plurality of horizontal scribe lines being defined by elongated mesas; and
providing a plurality of substantially parallel, vertical scribe lines with sloped sidewalls in said plurality of layers, each of said plurality of vertical scribe lines being defined by elongated mesas, said plurality of horizontal scribe lines intersecting said plurality of vertical scribe lines at substantially right angles;
wherein said plurality of horizontal scribe lines and each of said plurality of vertical scribe lines has a pair of sloped sidewalls provided by a larger width between facing sidewalls in a first layer closer to said substrate and a smaller width between facing sidewalls in a second layer farther from said substrate.

27. A method as recited in claim 26 wherein said plurality of layers includes alternating conductive layers and insulating layers.

28. A method as recited in claim 27, wherein said substrate is a silicon substrate, wherein said insulating layers are selected from the group consisting essentially of oxides, nitrides, and spin-on materials and wherein said conductive layers are selected from the group consisting essentially of (a) metals consisting essentially of aluminum, aluminum-copper alloy, titanium, tungsten, and titanium-tungsten alloys; and (b) non-metals consisting essentially of polycrystalline semiconductor materials and silicides.

* * * * *

UNITED STATES PATENT AND TRADEMARK OFFICE
CERTIFICATE OF CORRECTION

PATENT NO. : 5,795,815
DATED : August 18, 1998
INVENTOR(S) : Vokoun et al.

It is certified that error appears in the above-indentified patent and that said Letters Patent is hereby corrected as shown below:

Column 11, line 27, change "where in" to --wherein--
Column 11, line 28, after "second", insert --,--
Column 11, line 29, after, "third", insert --,--
Column 11, line 41, after "first", insert --,--

Signed and Sealed this

Twenty-fifth Day of May, 1999

Attest:

Q. TODD DICKINSON

*Attesting Officer*     *Acting Commissioner of Patents and Trademarks*